Figure 1:
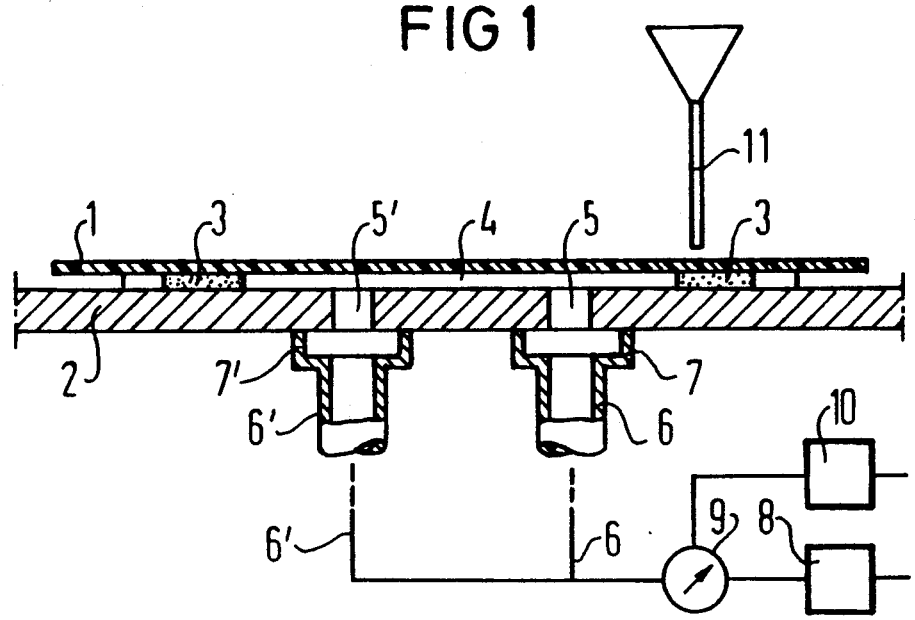

United States Patent [19]
Coques et al.

[11] Patent Number: 5,157,828
[45] Date of Patent: Oct. 27, 1992

[54] METHOD AND DEVICE FOR FASTENING AN ELECTRONIC CIRCUIT SUBSTRATE ONTO A SUPPORT

[75] Inventors: Pierre Coques; Pascal Deneau, both of Toulouse Cedex, France

[73] Assignee: Siemens Automotive S.A., Toulouse Cedex, France

[21] Appl. No.: 735,373

[22] Filed: Jul. 24, 1991

[51] Int. Cl.⁵ .......................... H05K 3/36; B23P 19/00
[52] U.S. Cl. .......................................... 29/830; 29/729; 118/50; 156/285; 156/295; 427/96; 427/294
[58] Field of Search ................... 29/830, 729; 118/50; 427/294, 96, 296; 156/295, 285

[56] References Cited

U.S. PATENT DOCUMENTS

| | | | |
|---|---|---|---|
| 4,478,882 | 10/1984 | Roberto | 118/50 X |
| 5,032,426 | 7/1991 | Sumner, Jr. | 427/294 X |
| 5,034,083 | 3/1991 | Campanelli | 156/285 X |

FOREIGN PATENT DOCUMENTS

| | | |
|---|---|---|
| 8601294 | 3/1986 | Fed. Rep. of Germany . |
| 1445156 | 5/1966 | France . |
| 62-156931 | 7/1987 | Japan . |

OTHER PUBLICATIONS

Publication IBM Technical Disclosure Bulletin, vol. 19, No. 8, Jan. 1977, p. 3018, T. Ross: "Self-Pressurized Container with Pressure Indicator".
Publication IBM Technical Disclosure Bulletin, vol. 16, No. 10, Mar. 1974, p. 3289 H. G. Bauer: "Vacuum Holding and Testing Fixture".

*Primary Examiner*—Carl J. Arbes
*Attorney, Agent, or Firm*—Herbert L. Lerner; Laurence A. Greenberg

[57] ABSTRACT

In a method and device for fastening an electronic circuit substrate onto a support, a looped line of an adhesive product in the viscous state is deposited on one of the surfaces of the substrate or the support to be fastened to one another. The surfaces are placed opposite each other in order to establish a space defined by the line of adhesive product and areas of the opposing surfaces inside the line. A reduced pressure is applied to the space by a suction device so as to squash the line of adhesive product between the two surfaces to be assembled, in order to spread the viscous adhesive product in a layer with a uniform thickness, and the layer formed in this way is dried. The method and device are applied to the fastening of electronic circuit substrates in protective casings.

14 Claims, 1 Drawing Sheet

METHOD AND DEVICE FOR FASTENING AN ELECTRONIC CIRCUIT SUBSTRATE ONTO A SUPPORT

CROSS-REFERENCE TO RELATED APPLICATION

This application is a Continuation of International Application Ser. No. PCT/EP90/00133, filed Jan. 24, 1990.

The invention relates to a method and a device for fastening an electronic circuit substrate onto a support and, more particularly, to a method of that type and a device of that type being constructed for fastening a planar substrate onto a planar support disposed parallel to the planar substrate by using an adhesive product.

Electronic apparatuses currently have circuits which are formed of active and/or passive components distributed over an insulating substrate on which conducting tracks are formed that connect the various components according to a predetermined connection plan. Such circuits must be protected from environmental attacks and, to this end, they are often enclosed in casings which form a mechanical protection for them. The substrates take the form of a rigid or semi-rigid board being fitted with components. The board is often fastened simply by gluing to an internal surface of a wall of the casing. In order to perform the gluing, a film of glue is traditionally deposited, by silk screen printing or application with a doctor blade, onto a surface of the board, and the coated surface is placed by hand onto the surface of the inner wall of the casing on which it is to be fastened. A degree of spreading of the glue between the two opposite glued surfaces is caused by sliding the two surfaces relative to each other. According to another technique, one or more drops of glue is deposited in the center of the pieces to be assembled and the assembly thereof is carried out simply by pressing the pieces against each other.

Such methods, which are often carried out manually, have various disadvantages. Firstly, it is difficult to ensure satisfactory parallelism of the glued surfaces that are placed opposite each other. There is no available means for enabling a uniform distribution of the glue between the surfaces to be ensured, and the presence of air bubbles in the layer of glue is often observed. Lastly, the assembly made by pressing the substrate onto the surface of the casing implies an application of sometimes very concentrated forces on the surface of the substrate carrying the components, for example by the fingers of an operator, which may damage the components or even the circuit formed on the substrate.

It has been possible to observe that the consequences of such disadvantages are (1) the formation of hot points during heat transfer between the substrate and a dissipator such as a heat sink or a ribbed casing, (2) parasitic vibrations during assembly by the ultrasonic method, in particular when connecting wires etc, and (3) the substrate becoming unstuck when the environmental conditions are unfavorable and entail, for example, the application of heat cycles to the substrate, as is the case in particular in automobile electronics.

It is accordingly an object of the invention to provide a method and device for fastening an electronic circuit substrate onto a support, which overcome the herein aforementioned disadvantages of the heretofore-known methods and devices of this general type, which enable the substrate to be fastened onto the support by an adhesive layer being free from air bubbles, with a regular thickness, and which is reproducible.

The object of the invention is also to provide a method of this type enabling the application of concentrated forces to be avoided on the surface of the substrate which carries a circuit and electronic components.

Further objects of the invention are to provide a method of this type which lends itself to advanced automation.

With the foregoing and other objects in view there is provided, in accordance with the invention, a method for fastening a planar electronic substrate onto a planar support, which comprises depositing a looped line of an adhesive product in a viscous state onto one of two surfaces of a mutually parallel planar electronic substrate or planar support to be fastened to one another, placing the surfaces to be fastened in mutually opposite positions defining areas of the opposite surfaces inside the line of adhesive product and defining a space delimited by the line of adhesive product and the areas of the opposite surfaces inside the line of adhesive product, applying a reduced pressure below ambient, atmospheric or environmental pressure to the space squashing the line of adhesive product between the two surfaces to be fastened and spreading the viscous adhesive product in a layer with a substantially constant thickness, and drying the layer.

In accordance with another mode of the invention, there is provided a method which comprises sucking gas out of the space, measuring a flow rate of the sucked out gas for controlling leak-tightness of the line of adhesive product, and correcting the positions of the opposite surfaces for changing or canceling the flow rate if necessary to ensure the application of a pressure below ambient pressure to the space.

In accordance with a further mode of the invention, there is provided a method which comprises depositing the line of adhesive product in a cushion-shaped contour having the same axis of symmetry as a rectangular substrate.

In accordance with an added mode of the invention, there is provided a method which comprises piercing at least one opening in one of the surfaces, and connecting the space to exterior suction means through the at least one opening.

With the objects of the invention in view, there is also provided in an assembly having means for receiving a unit of a planar support part having a surface, a substrate part having a surface opposite the surface of the planar support part, and a looped line of a viscous adhesive product separating the parts from each other and defining a space inside the line of adhesive product being delimited by the line of adhesive product and opposing areas of the surfaces of the parts inside the line of adhesive product, one of the parts having at least one opening passing through its thickness into the space, a device for fastening the planar electronic substrate part onto the planar support part, comprising suction means to be connected to the at least one opening for applying a reduced pressure below ambient, atmospheric or environmental pressure to the space for spreading the viscous adhesive product in a uniform layer by squashing the line of adhesive product between the parts.

In accordance with another feature of the invention, there are provided means for sucking gas out of the space with a given flow rate, and means sensitive to the flow rate for signaling an occurrence of a leak in the region of the line of adhesive product.

In accordance with a further feature of the invention, there are provided stop means interposed between the substrate part and the support part for setting a final thickness of the spread layer of adhesive product In accordance with an added feature of the invention, there are provided means for coating one of the surfaces of the parts with the looped line of adhesive product, means for superposing the substrate part and the support part in given locations on either side of the line of adhesive product, and means for connecting the unit to the suction means.

In accordance with a concomitant feature of the invention, the connection means also form means for receiving the support in an assembly position.

Other features which are considered as characteristic for the invention are set forth in the appended claims.

Although the invention is illustrated and described herein as embodied in a method and device for fastening an electronic circuit substrate onto a support, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
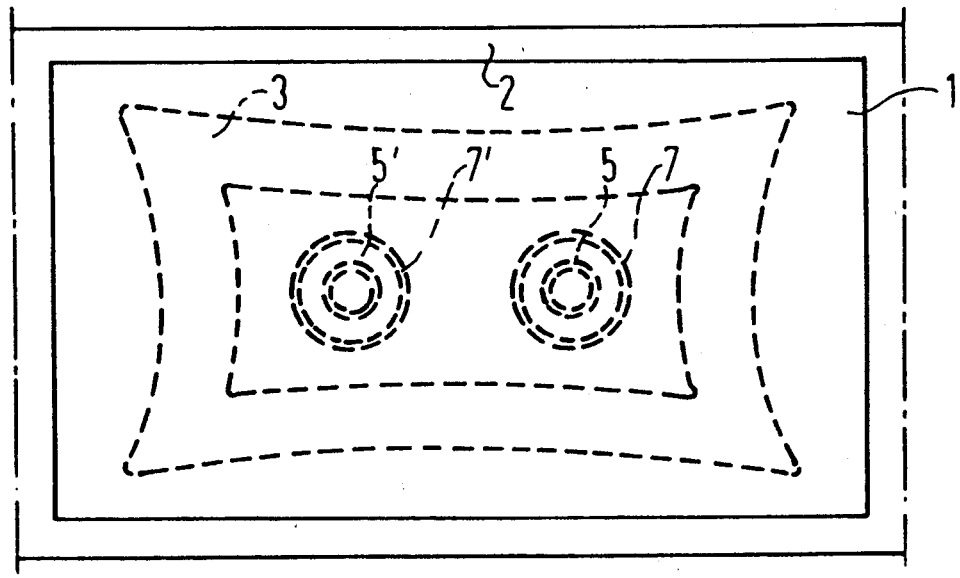

FIG. 1 is a fragmentary, diagrammatic, sectional view of a device for implementing the method according to the invention; and FIG. 2 is a plan view of the device of FIG. 1.

Referring now to the figures of the drawing in detail and first, particularly, to FIG. 1 thereof, there is seen an essential intermediate phase of a fastening method according to the invention, which is given merely by way of example. The object of the method is to fasten a substrate 1 onto a support 2 by means of a uniformly distributed intermediate adhesive layer forming a unit which may be disposed in means for receiving the unit. As a non-limiting example, the substrate may be a thick-layered hybrid circuit, in which case it is formed from alumina, glass, beryllium oxide, enameled metal sheeting or anodized aluminum, etc. A network of conductors and resistors forming part of an electronic circuit is deposited on a substrate of this type by silk screen printing. The circuit is completed by active and passive components attached to the substrate. A hybrid circuit of this type is available either bare or coated in a resin, or alternatively packaged in a ceramic, metal or plastic casing. In the latter case, it may be fastened onto an internal wall of the casing by gluing. This wall of the casing then forms the support 2 which receives the substrate 1.

According to the invention, in order to fasten this substrate onto a support of this type, a looped line 3 of an adhesive product in the viscous state is deposited either on a surface of the substrate or on the surface of the support which is intended to face this substrate. These surfaces are placed one on the other as shown in FIG. 1, in order to establish a space 4 defined by the line 3 and the areas of the opposing surfaces which are inside the line 3. Reduced pressure is applied to the space 4 so as to squash the line 3 between the two surfaces to be assembled in order to spread the adhesive between these surfaces. Lastly, the layer formed in this way is dried.

In order to apply reduced pressure to the space 4 relative to the ambient atmospheric or environmental pressure, the invention proposes to pierce at least one opening in the support 2 or in the substrate 1 which connects the space 4 with the other surface of the support 2 or of the substrate 1. In the region of this opening, this space 4 is connected to suction means forming a part of the device for implementing the method according to the invention. According to a first embodiment of the invention, an opening 5 is pierced in the support 2. According to a second non-illustrated embodiment, the opening is pierced in the substrate.

In addition to a vacuum source 8, the suction means essentially include at least one duct 6 having attachment means such as a suction cap 7. Two ducts 6, 6' are respectively combined with suction cap 7, 7' that are shown in the drawing to be constructed in such a way as to be attached to respective openings 5, 5' pierced in the support 2 (or to corresponding openings pierced in the substrate 1) so as to ensure a uniform distribution of the reduced pressure applied in the space 4 inside the line 3.

According to an advantageous embodiment of the device according to the invention, the suction caps 7, 7' form both means for receiving the support 2 in the gluing position and means for attaching the openings 5, 5' to the suction means.

The device according to the present invention may also advantageously include means for locating the openings 5, 5'and the suction cap 7, 7' during installation of the support 2 in the device, with a view toward the gluing operations.

The line 3 of adhesive that is necessary for the assembly may be formed either on the substrate 1 or on the support 2. As a non-limiting example, an adhesive product which is appropriate for this use may, for example, be DOW CORNING Q 19233 glue. Whether the line 3 of adhesive is formed on the substrate or on the support, when the substrate to be glued is rectangular in shape, it has been observed that a more uniform spreading of the adhesive is obtained when the line 3 is given the shape shown in FIG. 2. In FIG. 2, this line follows an approximately cushion or pillow-shaped contour having the same axes of symmetry as the substrate 1 to be fastened on the support 2. The line 3 of adhesive may be deposited on the substrate or the support by any known coating method, for example by silk screen printing.

While this adhesive is still fluid, the substrate 1 is superposed in a location on the support 2, in the position shown in FIG. 1. The start-up of the vacuum source then applies a reduced pressure to the space 4 and the ambient atmospheric pressure then applies a uniform pressure over the area of the substrate 1 which is inside the line 3, which causes the line 3 of adhesive to be squashed between the substrate and the support, thus causing a spreading of this adhesive in a layer with a thickness which is also uniform, between the support and the substrate. Advantageously, the adhesive spreads between the substrate and the support until it comes to plug the openings 5 and 5', which automatically causes the application of pressure on the substrate 1 to simultaneously cease. The adhesive is then spread in a layer with a uniform thickness over the entire surface of the opposing areas of the substrate and of the support. The drying of the layer of adhesive may then be carried out and the assembly may thus be completed.

Satisfactory operation of the device according to the invention is dependent on the absence of leaks in the region of the line 3 when a reduced pressure is applied to the space 4. In order to avoid any difficulty from this point of view, the device according to the invention may be equipped with means 9 for measuring the flow rate of the gas being sucked in when a reduced pressure is applied in the space 4, and means 10 being sensitive to the level of the gas flow rate for signaling any occurrence of a leak in the region of the line 3 of adhesive. Manual or automatic corrective measures are then implemented to suppress this leak. It will be observed in this connection that if the substrate 1 has a sufficient weight, the squashing of the line 3 under the influence of the weight of the substrate 1, when the latter is superposed on the support 2, is normally sufficient to prevent the occurrence of such leaks. The line 3 of adhesive product is deposited by means of coating means 11 on a surface of the substrate 1 or on a surface of the support 2. Due to the uniformity of the atmospheric pressure applied on the substrate 1 during the operation of the suction means, spreading of the adhesive is obtained in a continuous layer with a very uniform thickness which ensures the parallelism of the substrate and the support. Due to this parallelism and the continuity of the layer on the opposing areas of the substrate and the support, the transfers of heat required for cooling the components carried by the substrate take place without hot points that are capable of damaging the circuit carried by the substrate. In addition, the uniformity of this heat transfer is improved by the fact that the suction = enables any air bubbles in the layer of adhesive which are spread by the method according to the invention to be removed. These bubbles are sucked out of the space 4 and sucked in by the ducts 6 and 6' during the operation of the suction means.

The method according to the invention thus allows a substrate and a support to be assembled by using a layer of adhesive with a uniform thickness, for example on the order of a tenth of a millimeter. If it is desired to fix the thickness of this layer precisely, it is possible to combine stop means such as spacing blocks with predetermined thicknesses, either with the support or with the substrate. Such stop means are represented by lines disposed to the left of the left-hand portion of adhesive and to the right of the right-hand portion of adhesive, in FIG. 1.

Good substrate/support parallelism, and continuity and uniformity of the layer of adhesive distributed between them, which are obtained by the method and the device according to the present invention, give rise to the following advantages:

1) the absence of hot points during transfers of heat between the substrate and the support; as seen above, this absence of hot points has been confirmed by thermographic photographs, 2) the suppression of the appearance of parasitic vibrations during ultrasonic welding operations on the circuit carried by the substrate, 3) the improved resistance of the substrate to coming unstuck in a difficult environment, such as in automobile electronics, 4) the retention of the integral nature of the circuit carried by the substrate as a result of the absence of concentrated forces on the latter when the substrate is pressed against the support.

In addition to the quality and the reliability of the assembly obtained by the method according to the present invention, it will be noted that it lends itself to an advanced automation.

The invention is, of course, not limited to the embodiment that is described and shown which has been given merely by way of example. In particular, the invention is not limited to the fastening in a casing of a substrate carrying a thick-layered hybrid circuit. On the contrary, the invention extends to fastening onto a support of any electronic circuit, such as a thin-layered hybrid circuit or even a printed circuit.

We claim:

1. A method for fastening a planar electronic substrate onto a planar support, which comprises:
   (a) depositing a looped line of an adhesive product in a viscous state onto one of two surfaces of a mutually parallel planar electronic substrate and planar support to be fastened to one another,
   (b) placing the surfaces to be fastened in mutually opposite positions defining areas of the opposite surfaces inside the line of adhesive product and defining a space delimited by the line of adhesive product and the areas of the opposite surfaces inside the line of adhesive product,
   (c) applying a reduced pressure below ambient pressure to the space squashing the line of adhesive product between the two surfaces to be fastened and spreading the viscous adhesive product in a layer with a substantially constant thickness, and
   (d) drying the layer.

2. The method according to claim 1, which comprises sucking gas out of the space, measuring a flow rate of the sucked out gas for controlling leak-tightness of the line of adhesive product, and correcting the positions of the opposite surfaces for changing the flow rate if necessary to ensure the application of a pressure below ambient pressure to the space.

3. The method according to claim 1, which comprises depositing the line of adhesive product in a cushion-shaped contour having the same axis of symmetry as a rectangular substrate.

4. The method according to claim 1, which comprises piercing at least one opening in one of the surfaces, and connecting the space to exterior suction means through the at least one opening.

5. An assembly, comprising a unit of a planar support part having a surface, a planar electronic substrate part having a surface opposite the surface of the planar support part, and a looped line of a viscous adhesive product separating the parts from each other and defining a space inside the line of adhesive product being delimited by the line of adhesive product and opposing areas of the surfaces of the parts inside the line of adhesive product, one of the parts having at least one opening passing through it into the space, and a device for fastening the planar electronic substrate part onto the planar support part, the device including suction means connected to the at least one opening for applying a reduced pressure below ambient pressure to the space for spreading the viscous adhesive product in a uniform layer by squashing the line of adhesive product between the parts.

6. The assembly according to claim 5, including means for sucking gas out of the space with a given flow rate, and means sensitive to the flow rate for signaling an occurrence of a leak in the region of the line of adhesive product.

7. The assembly according to claim 5, wherein the device includes stop means operatively associated with the suction means and interposed between the substrate part and the support part for setting a final thickness of the spread layer of adhesive product when the line of adhesive product is squashed between the parts.

8. The assembly according to claim 6, wherein said device includes stop means operatively associated with and interposed between the substrate part and the support part for setting a final thickness of the spread layer of adhesive product when the line of adhesive product is squashed between the parts.

9. The assembly according to claim 5 wherein the device includes means for coating one of the surfaces of the parts with the looped line of adhesive product, means operatively associated with the unit for superposing the substrate part and the support part in given locations on either side of the line of adhesive product, and means operatively associated with the unit for connecting the unit to the suction means.

10. The assembly according to claim 6, wherein the device includes means for coating one of the surfaces of the parts with the looped line of adhesive product, means operatively associated with the unit for superposing the substrate part and the support part in given locations on either side of the line of adhesive product, and means operatively associated with the for connecting the unit to the suction means.

11. The assembly according to claim 7, wherein the device includes means for coating one of the surfaces of the parts with the looped line of adhesive product, means operatively associated with the unit for superposing the substrate part and the support part in given locations on either side of the line of adhesive product, and means operatively associated with the unit for connecting the unit to the suction means.

12. The assembly according to claim 9, wherein said connection means also form means for receiving the support in an assembly position.

13. The assembly according to claim 10, wherein said connection means also form means for receiving the support in an assembly position.

14. The assembly according to claim 11, wherein said connection means also form means for receiving the support in an assembly position.

* * * * *

UNITED STATES PATENT AND TRADEMARK OFFICE
CERTIFICATE OF CORRECTION

PATENT NO. : 5,157,828
DATED : October 27, 1992
INVENTOR(S) : Pierre Coques, Pascal Deneau It is certified that error appears in the above—identified patent and that said Letters Patent is hereby corrected as shown below:

On title page, item [30] "Foreign Application Priority Data"

insert --January 25, 1989 (FR) France..... 89 00891--.

Signed and Sealed this

Third Day of May, 1994

Attest:

BRUCE LEHMAN

Attesting Officer

Commissioner of Patents and Trademarks